(12) United States Patent
SubramanyamNasum et al.

(10) Patent No.: US 11,715,707 B2
(45) Date of Patent: Aug. 1, 2023

(54) APPARATUS INCLUDING AN ISOLATION ASSEMBLY

(71) Applicant: Texas Instruments Incorporated, Dallas, TX (US)

(72) Inventors: Sreeram SubramanyamNasum, Bangalore (IN); Vijaylaxmi Khanolkar, Pune (IN); Tarunvir Singh, Punjab (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 266 days.

(21) Appl. No.: 16/730,856

(22) Filed: Dec. 30, 2019

(65) Prior Publication Data
US 2021/0202405 A1 Jul. 1, 2021

(51) Int. Cl.
*H01L 23/64* (2006.01)
*H01L 23/495* (2006.01)

(52) U.S. Cl.
CPC ........ *H01L 23/642* (2013.01); *H01L 23/4952* (2013.01); *H01L 23/49503* (2013.01); *H01L 23/49575* (2013.01)

(58) Field of Classification Search
CPC ................ H01L 23/488–49894; H01L 23/642
See application file for complete search history.

(56) References Cited

U.S. PATENT DOCUMENTS

| | | | |
|---|---|---|---|
| 2013/0037909 A1* | 2/2013 | French | H01L 23/49575 257/532 |
| 2015/0001948 A1* | 1/2015 | Brauchler | H01L 23/49575 438/109 |
| 2015/0004902 A1* | 1/2015 | Pigott | H04B 5/0031 455/41.1 |
| 2015/0069572 A1* | 3/2015 | Khanolkar | H01L 28/10 257/531 |

* cited by examiner

*Primary Examiner* — Andres Munoz
(74) *Attorney, Agent, or Firm* — Dawn Jos; Frank D. Cimino (57) ABSTRACT

Described examples include an apparatus including a package substrate having a die attach pad and a first semiconductor die on the die attach pad, the first semiconductor die including a transmitter. The apparatus also includes an assembly having a first plate coupled to the transmitter, a second plate separated from the first plate by a dielectric and a second semiconductor die on the die attach pad, the second semiconductor die including a receiver coupled to the second plate.

15 Claims, 7 Drawing Sheets

APPARATUS INCLUDING AN ISOLATION ASSEMBLY

TECHNICAL FIELD

This application relates generally to packaged semiconductor dies, and in particular to isolation between semiconductor dies within a package.

BACKGROUND

Hybrid packages are packages that include more than one semiconductor die within the package. An example hybrid package includes one semiconductor die designed to handle high voltages (e.g., 20 Volts or more) and another semiconductor die that controls the high voltage semiconductor die. An example is a node on a controller area network (CAN) bus in an automobile. Some devices in industrial or automotive applications require a very high voltage from, for example, 20 volts to a range of several hundred volts. One example is suspension control devices. A processor controls these devices via the CAN bus, which operates at 2 to 4 volts. Therefore, in some hybrid devices, a lower voltage semiconductor die provides for communication with and control of a high voltage semiconductor die that reside together in a hybrid package.

In these types of hybrid devices, the controlling semiconductor die includes small, fast devices for rapid computation and control. The higher voltages of the high voltage semiconductor die can damage the devices of the controlling semiconductor die. Although the two semiconductor dies must communicate, they also must be voltage isolated to prevent damage to the controlling semiconductor die. An example isolation device is a laser emitting diode that is optically coupled to a photoreceiver in the package. However, this type of isolation is costly and not reliable. Another example is using two separate packages coupled by an isolation device in a third package. However, this example requires three separate packages, which also increases costs.

SUMMARY

In accordance with an example, an apparatus includes a package substrate having a die attach pad and a first semiconductor die on the die attach pad, the first semiconductor die including a transmitter. The apparatus also includes an assembly having a first plate coupled to the transmitter, a second plate separated from the first plate by a dielectric and a second semiconductor die on the die attach pad, the second semiconductor die including a receiver coupled to the second plate.

DETAILED DESCRIPTION

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Elements referred to herein as "optically coupled" are elements that include a connection between the elements that involves transmission of light. Elements referred to herein as "capacitively coupled" are elements that include a connection between elements that involves capacitance, that is, plates or metal areas that are separated by a dielectric for the communication of signals between elements. Also, as used herein, the terms "on" and "over" may include layers or other elements where intervening or additional elements are between an element and the element that it is "on" or "over." Also, as used herein, the term "proximate" indicates that two or more components are close enough to each other to provide capacitive coupling between the components, but that the components are not in conductive contact. In practical examples, the components are spaced far enough so that arcing, electromigration, and other potential conductive connections are avoided. Also, as used herein, a "driver" is a circuit designed to provide power to another device in a controlled manner to produce a desired action, such as movement of a solenoid or illumination.

The term "semiconductor device" is used herein. A semiconductor device can be a discrete semiconductor device such as a bipolar transistor, a few discrete devices such as a pair of power field effect transistor (FET) switches fabricated together on a single semiconductor die, or a semiconductor device can be an integrated circuit with multiple semiconductor devices such as the multiple capacitors in an analog-to-digital (A/D) converter. The semiconductor device can include passive devices such as resistors, inductors, filters, or active devices such as transistors. The semiconductor device can be an integrated circuit with hundreds, thousands, or more of transistors coupled to form a functional circuit, for example a microprocessor or memory device. The semiconductor device can be a passive device such as a sensor, example sensors include photocells, transducers, and charge coupled devices (CCDs), or can be a micromechanical device, such as a digital micromirror device (DMD) or a micro electro-mechanical system (MEMS) device. The term "semiconductor die" is used herein. A semiconductor die is a device that is formed using semiconductor processing with other semiconductor devices on a semiconductor substrate, such as a silicon wafer, and then is separated from the semiconductor wafer and the other devices to form an individual semiconductor die. Also, as used herein, "bond wire(s)" means any conductive connection between bond pads, including bond wires, bond ribbons and other mechanisms.

The term "package substrate" is used herein. A package substrate is a component used in mounting and packaging a semiconductor die. Examples includes a lead frame as the package substrate. Other package substrates useful with the arrangements include pre-molded lead frames (PMLF). In addition, useful package substrates for the arrangements include conductive lead frames, partially etched or half-etched conductive lead frames, and molded interconnect substrates (MIS). The package substrate can be a film, laminate or tape that carries conductors, or can be a printed circuit board such as reinforced fiber glass (FR4), bismaleimide triazine (BT) resin, alumina, silicon carbide, or aluminum nitride. The materials for the package substrate can include conductors such as copper and copper alloys, iron-nickel alloys such as Alloy 42, and gold and gold alloys, which may include platings such as nickel, palladium, tin, gold, solder and combinations such as ENIG (electroless nickel immersion gold) and ENEPIG (electroless nickel, electroless palladium, immersion gold) and combinations to promote solderability, increase adhesion, and to reduce or prevent corrosion or oxidation of metals, such as copper or aluminum. These platings improve solderability, bondability, reduce diffusion and reduce possible corrosion. The package substrates can include dielectrics including silicon, glass, mold compound, ceramic, polyimide, fiberglass, and resins. Multiple levels of conductors spaced from one another by dielectric layers and conductive vias forming conductive connections between the multiple conductor levels can be used in the package substrates. The term "die attach pad" is also used herein. A die attach pad is a portion of the package substrate designed for attachment of one or more semiconductor devices. In some examples, the semiconductor device(s) are attached to the die attach pad using a conductive adhesive or solder.

In example arrangements, the problem of providing cost effective isolative coupling between dies in a package is solved by an assembly within the package that includes a capacitive coupling device. In an example arrangement, an apparatus includes a package substrate having a die attach pad and a first semiconductor die on the die attach pad, the first semiconductor die including a transmitter. The apparatus also includes an assembly having a first plate coupled to the transmitter, a second plate separated from the first plate by a dielectric and a second semiconductor die on the die attach pad, the second semiconductor die including a receiver coupled to the second plate.

Figure 1:
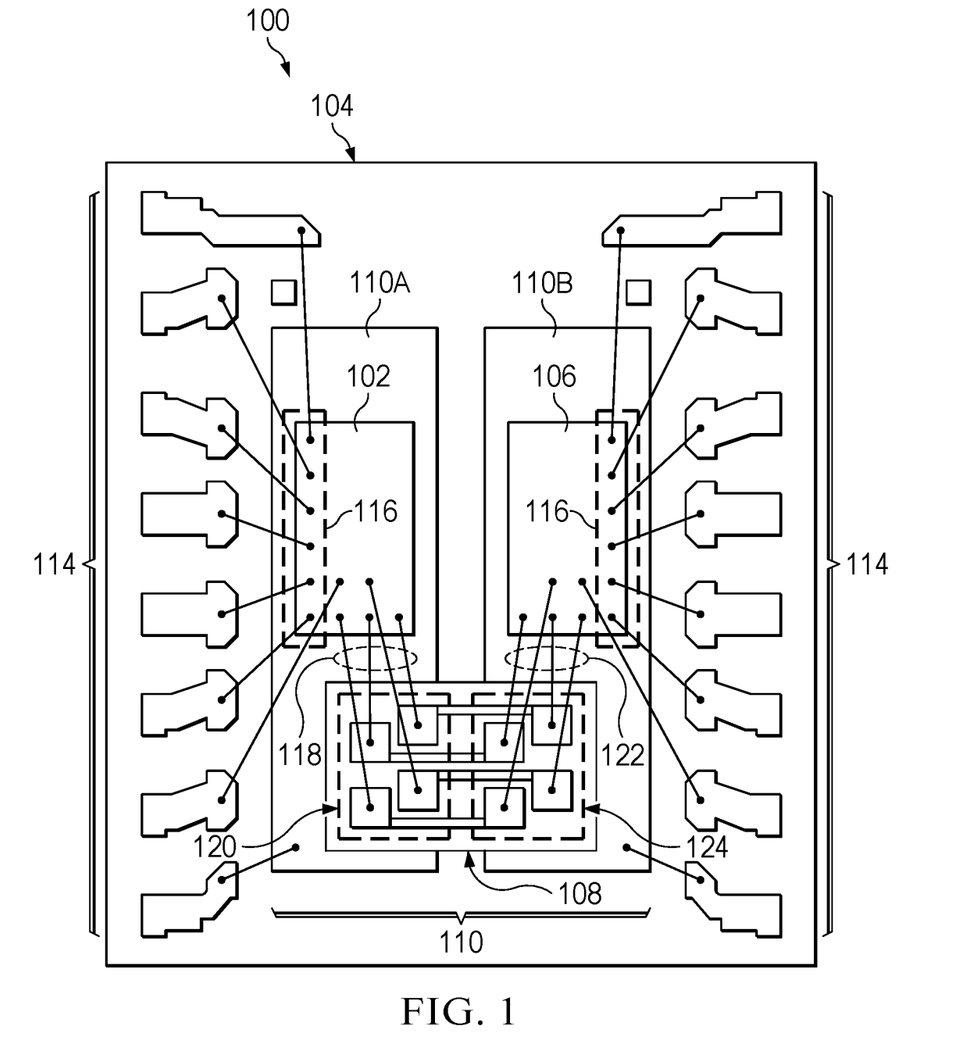
FIG. 1 is a plan view of an example apparatus.

FIG. 1 is a plan view of an example apparatus 100. In this example, apparatus 100 is a hybrid package including a first semiconductor die 102 on a package substrate 104, a second semiconductor die 106 on the package substrate 104 and an assembly 108 on the package substrate. In an example, first semiconductor die 102 is a controller for controlling the second semiconductor die 106, which is a driver for providing driving power to an external component (not shown). In this example, first semiconductor die 102, second semiconductor die 106 and assembly 108 are attached to die attach pad 110. In this example, die attach pad 110 includes two die attach pads: die attach pad 110A and die attach pad 110B. First semiconductor die 102 is attached to die attach pad 110A and second semiconductor die 106 is attached to die attach pad 110B. Assembly 108 is attached to both die attach pad 110A and die attach pad 110B. Splitting the die attach pad 110 provides isolation between first semiconductor die 102 and second semiconductor die 106. For example, first semiconductor die 102 may have an operating voltage of 1.5 to 5 volts and provide logic and communication for apparatus 100. On the other hand, second semiconductor die may include high power transistors that operate at twenty volts or more. Splitting die attach pad 110 prevents the higher voltage of second semiconductor die 106 from affecting, and perhaps damaging, first semiconductor die 102. In this example, first semiconductor die 102 and second semiconductor die 106 are attached to die attach pad 110 using a thermally and electrically conductive paste. Assembly 108 is attached to die attach pad 110 with thermally conductive paste.

Die attach pad 110 is part of package substrate 104. In this example, package substrate 104 is a pre-molded lead frame (PMLF) that includes leads 114. In this example, bond wires 116 couple from bond pads (not shown) on first semiconductor die 102 and second semiconductor die 106 to leads 114. In addition, bond wires 118 couple from bond pads (not shown) on first semiconductor die 102 to plates 120 of assembly 108. Bond wires 122 couple from bond pads (not shown) on second semiconductor die 106 to plates 124 of assembly 108. In this example, plates 120 and plates 124 are a copper alloy. In other examples, plates 120 and plates 124 are copper, aluminum, iron-nickel alloys such as Alloy 42, gold, or gold alloy. In some examples, plates 120 and plates 124 can include platings such as nickel, palladium, tin, gold, solder and combinations such as ENIG (electroless nickel immersion gold) and ENEPIG (electroless nickel, electroless palladium, immersion gold) and combinations to promote solderability, increase adhesion, and to reduce or prevent corrosion or oxidation of metals, such as copper or aluminum. In this example, a mold compound (not shown) or other enclosing structure covers and protects first semiconductor die 102, second semiconductor die 106, assembly 108, bond wires 116, bond wires 118, and bond wires 122. In another example (not shown), first semiconductor die 102, second semiconductor die 106 and assembly 108 have a "flip-chip" configuration where bond pads face package substrate 104 and couple to leads 114 using, for example, solder balls. In this example, package substrate 104 would include multiple levels of metallization to provide the necessary interconnections between first semiconductor die 102, second semiconductor die 106 and assembly 108. The use of a "flip-chip" configuration may allow for a more compact hybrid package and provide higher yield of hybrid packaged devices by avoiding the use of delicate bond wires.

Figure 2:
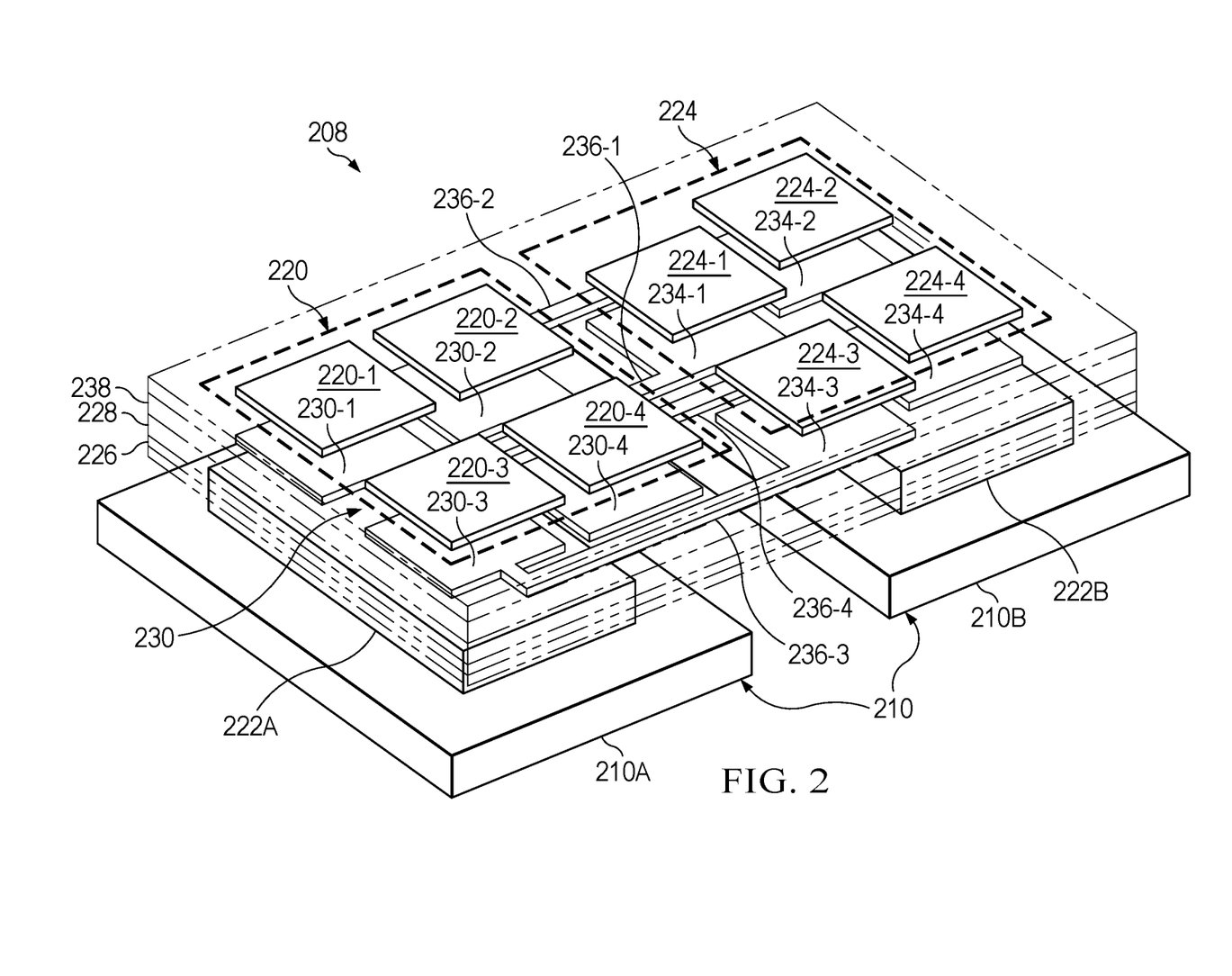
FIG. 2 is a perspective view of an assembly.

FIG. 2 is a perspective view of assembly 208. For clarity of understanding, similar reference numerals are used for similar elements in FIG. 2 as shown in FIG. 1. For example, assembly 208 corresponds to assembly 108 (FIG. 1). Plates 220 are like plates 120 (FIG. 1). Plates 224 are like plates 124 (FIG. 1). Die attach pad 210, which includes die attach pad 210A and die attach pad 210B, is like die attach pad 110, which includes die attach pad 110A and die attach pad 110B (FIG. 1), respectively. In this example, die attach pad 210A includes mesa 222A and die attach pad 210B includes mesa 222B. Lower portion 226 of assembly 208 has a shape of the portion that interfaces with mesa 220A and mesa 220B that matches mesa 220A and mesa 220B to facilitate quick and accurate placement of assembly 208. In this example, lower portion 226 is a multi-layer structure, including metal layers, of bismaleimide triazine (BT) resin. In other examples, lower portion 226 is reinforced fiber glass (FR4), alumina, silicon carbide, aluminum nitride, or another moldable, non-conductive compound. Metal layer 228 is on lower portion 226. In this example, metal layer 228 is a copper alloy. In other examples, metal layer 228 is copper, iron-nickel alloys such as Alloy 42, gold, or gold alloy. In some examples metal layer 228 includes additional platings such as nickel, palladium, tin, gold, solder and combinations such as ENIG (electroless nickel immersion gold) and ENEPIG (electroless nickel, electroless palladium, immersion gold) and combinations to promote solderability, increase adhesion, and to reduce or prevent corrosion or oxidation of metals, such as copper or aluminum. In examples, screen printing or metal deposition followed by photolithographic patterning forms metal layer 228.

Metal layer 228 includes plates 230 and plates 234. Plates 230 includes second plate 230-1, sixth plate 230-2, tenth plate 230-3 and fourteenth plate 230-4. Plates 234 includes third plate 234-1, seventh plate 234-2, eleventh plate 234-3 and fifteenth plate 234-4. First lead 236-1 couples second plate 230-1 to third plate 234-1. Second lead 236-2 couples sixth plate 230-2 to seventh plate 234-2. Third lead 236-3 couples tenth plate 230-3 to eleventh plate 234-3. Fourth lead 236-4 couples fourteenth plate 230-4 to fifteenth plate 234-4. Interlevel layer 238 is on metal layer 228. In this example, interlevel layer 238 is approximately 3µ to 500µ thick. In this example, interlevel layer 238 is a molding of bismaleimide triazine (BT) resin attached to metal layer 228 and the exposed portions of lower portion 226 by an adhesive. In other examples, interlevel layer 238 is a molding of reinforced fiber glass (FR4), alumina, silicon carbide, aluminum nitride, or another moldable, non-conductive compound. In examples, screen printing or metal deposition followed by photolithographic patterning forms plates 220 and plates 224 on interlevel layer 238. First plate 220-1 is proximate to second plate 230-1, and thus first plate 220-1 and second plate 230-1 are capacitively coupled. Fifth plate 220-2 is proximate to sixth plate 230-2, and thus fifth plate 220-2 and sixth plate 230-2 are capacitively coupled. Ninth plate 220-3 is proximate to tenth plate 230-3, and thus ninth plate 220-3 and tenth plate 230-3 are capacitively coupled. Thirteenth plate 220-4 is proximate to fourteenth plate 230-4, and thus thirteenth plate 220-4 and fourteenth plate 230-4 are capacitively coupled. Fourth plate 224-1 is proximate to third plate 234-1, and thus fourth plate 224-1 and third plate 234-1 are capacitively coupled. Eighth plate 224-2 is proximate to seventh plate 234-2, and thus eighth plate 224-2 and seventh plate 234-2 are capacitively coupled. Twelfth plate 224-3 is proximate to eleventh plate 234-3, and thus twelfth plate 224-3 and eleventh plate 234-3 are capacitively coupled. Sixteenth plate 224-4 is proximate to fifteenth plate 234-4, and thus sixteenth plate 224-4 and fifteenth plate 234-4 are capacitively coupled. FIG. 2 shows 8 plates which correspond to the top plates shown in FIG. 1. The first set of top plates are coupled to the first transmitters or first receivers of the first semiconductor die 102. That is the first plate 220-1 and the fifth plate 220-2 are coupled (via two wire bonds) to the first transmitter and the second transmitter. The ninth plate 220-3 and the thirteenth plate 220-4 are coupled (via two wire bonds) to the first receiver and the second receiver. Similarly, the second set of top plates includes the fourth plate 224-1, the eighth plate 224-2, the twelfth plate 224-3, and the sixteenth plate 224-4. The second semiconductor die includes a third transmitter, a third receiver, a fourth transmitter, and a fourth receiver. The third transmitter is coupled (via the wire bond) to the fourth plate 224-1, the fourth receiver is coupled (via the wire bond) to the eighth plate 224-2, the third transmitter is coupled to the twelfth plate 224-3 and the fourth transmitter is coupled to the sixteenth plate 224-4.

Figure 3A:
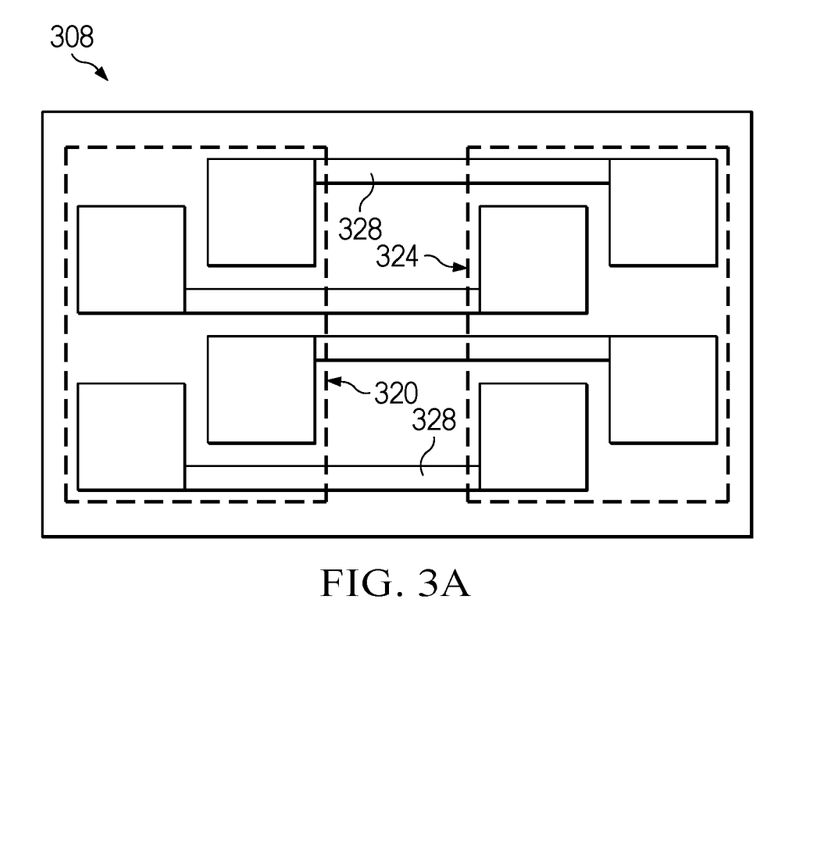
FIGS. 3A-C (collectively "FIG. 3") are plan views of an assembly.
Figure 3B:
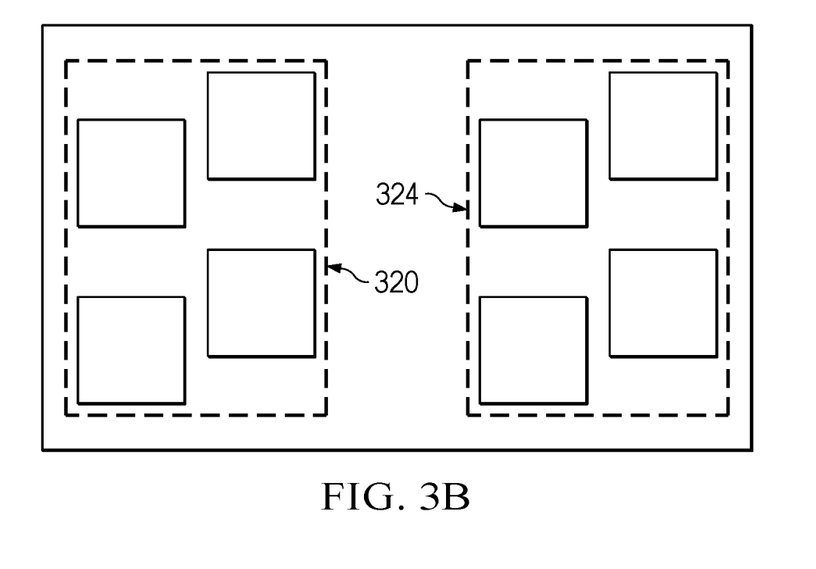
Figure 3C:
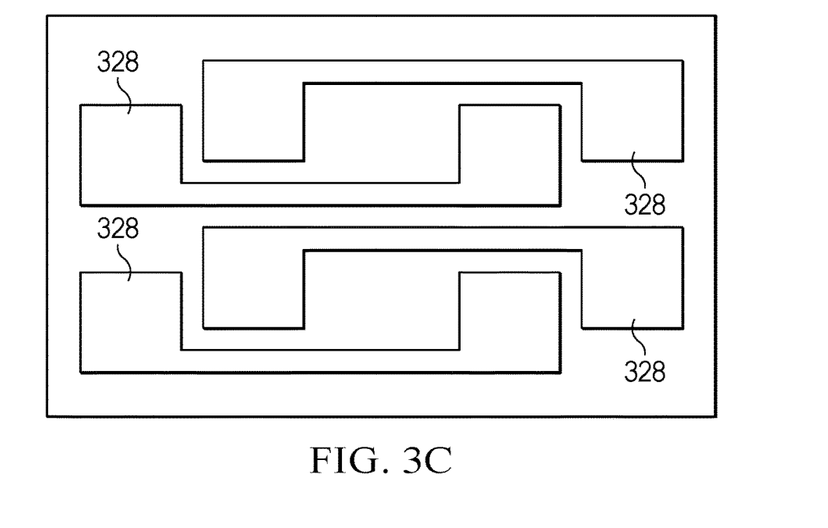

FIGS. 3A-C (collectively "FIG. 3") are plan views. FIG. 3A is a plan view of assembly 308. For clarity of understanding, similar reference numerals are used for similar elements in FIG. 3 as shown in FIG. 2. FIG. 3A shows the positioning of plates 320, which are like plates 220 (FIG. 2) and plates 324, which are like plates 224 (FIG. 2) relative to metal layer 328, which is like metal layer 228 (FIG. 2). FIG. 3B is a plan view of plates 320 and plate 324. FIG. 3C is a plan view of metal layer 328.

Figure 4:
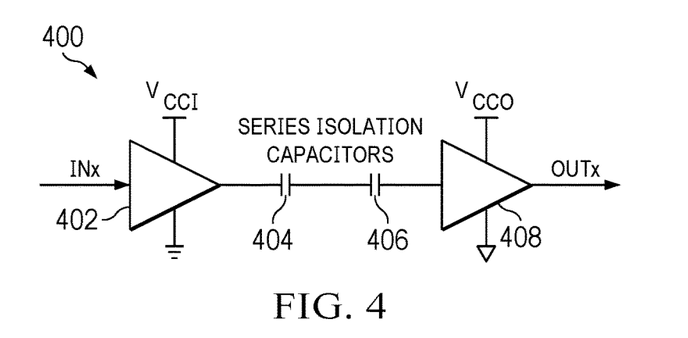
FIG. 4 is a schematic diagram of a communication channel.

FIG. 4 is a schematic diagram of a communication channel 400. Communication channel 400 includes transmitter 402, capacitor 404, capacitor 406 and receiver 408. As an example, first plate 220-1 and second plate 230-1 (FIG. 2) are one capacitor like capacitor 404. Fourth plate 224-1 and third plate 234-1 (FIG. 2) are a second capacitor like capacitor 406. First lead 236-1 couples second plate 230-1 and third plate 234-1 (FIG. 2), which is like the coupling between capacitor 404 and capacitor 406. Thus, capacitor 404 and capacitor 406 have a back-to-back configuration. As an example, apparatus 100 (FIG. 1) uses four communication channels like communication channel 400 to provide a two channel differential pair system. In an example, first semiconductor die 102 (FIG. 1) includes two transmitters like transmitter 402 and two receivers like receiver 408. Similarly, second semiconductor die 106 (FIG. 1) includes two receivers like receivers 408 and two transmitters like transmitter 402. As shown in FIG. 4, transmitter 402 is driven by a voltage supply $V_{cCI}$ and a ground that are provided by the semiconductor die that includes transmitter 402. Similarly, receiver 408 is driven be a voltage $V_{CCO}$ and ground that are provided by the semiconductor die that includes receiver 408.

Figure 5:
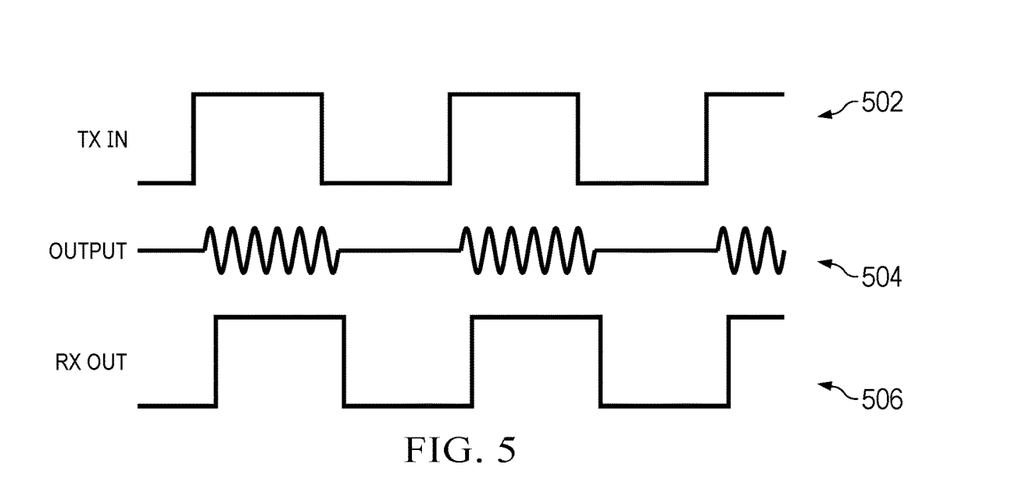
FIG. 5 includes timing diagrams that illustrate an example operation of a communication channel.

FIG. 5 are timing diagrams that illustrate an example operation of communication channel 400 (FIG. 4). In this example, communication channel 400 operates by on-off keying (OOK). With OOK, a digital "one" is transmitted by a carrier frequency. A digital "zero" is indicated by the lack of the carrier frequency. Trace 502 shows the digital signal INx from FIG. 4. Trace 504 shows the resulting output of transmitter 402 (FIG. 4). When INx is high (a digital "one") transmitter 402 transmits a sine wave signal at a fixed frequency, after a signal processing delay. The frequency of the transmitted sine wave is selected for efficiency of transmission through capacitor 404 and capacitor 406. In an example, the plates of assembly 108 (FIG. 1) are approximately 0.3 mm square. With an interlevel layer 238 thickness of 3µ to 500µ, capacitor 404 and capacitor 406 have a capacitance of approximately 50 pF-100 pF. The leads and bond wires coupling transmitter 402, capacitor 404, capacitor 406 and receiver 408 provide some parasitic inductance, so the signal path from transmitter 402 to receiver 408 has some level of resonance. A transmission frequency is chosen to provide efficient transmission between transmitter 402 and receiver 408. In an example, the carrier frequency is approximately 5 MHz to 500 MHz. When receiver 408 receives the carrier frequency, receiver 408 outputs a digital "one" (after a small processing and transmission delay) on OUTx as shown in trace 506. When receiver 408 (FIG. 4) does not receive the carrier frequency, receiver 408 outputs a digital "zero." Thus, digital information transmits from one semiconductor die to another without any conductive connection between the dies. In other examples, any signal that will transmit through a capacitive coupling may be used, such as a pulse signal and other types of signals having an alternating current component, such as frequency modulation.

Figure 6:
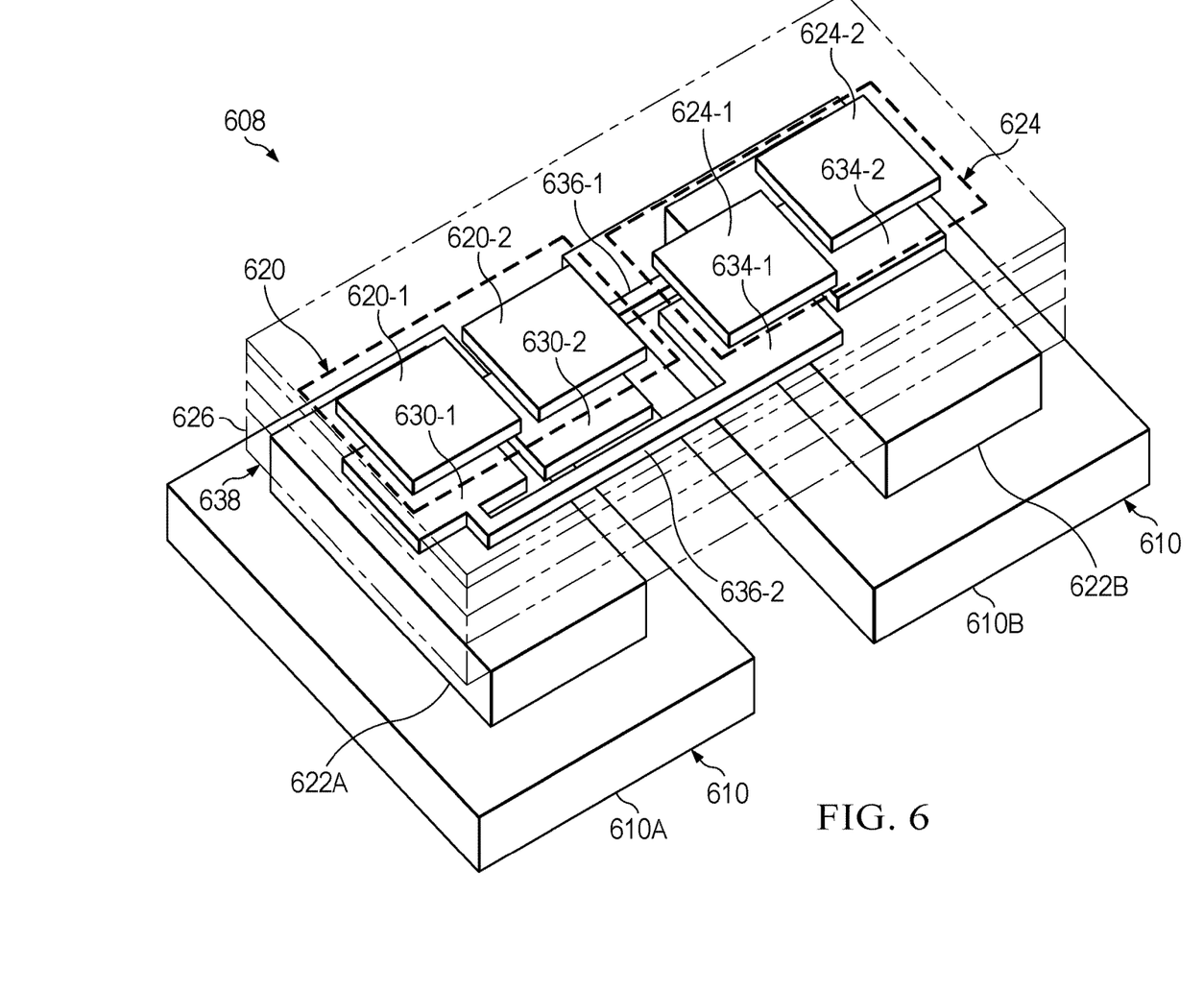
FIG. 6 is a perspective diagram of another example assembly.

FIG. 6 is a perspective diagram illustrating another example assembly 608. For clarity of understanding, similar reference numerals are used for similar elements in FIG. 6 as shown in FIG. 2. Die attach pad 610, which is like die attach pad 210 (FIG. 2), includes die attach pad 610A and die attach pad 610B, which are like die attach pad 210A and die attach pad 210B (FIG. 2), respectively. Mesa 622A is like mesa 222A (FIG. 2). Mesa 622B is like mesa 222B (FIG. 2). Lower portion 626 is like lower portion 226 (FIG. 2). In comparison to assembly 208 (FIG. 2), assembly 608 includes two communication channels, which may serve as a differential pair in a single communication channel; while assembly 208 includes a single channel. First plate 620-1, fifth plate 620-2, fourth plate 624-1, and eighth plate 624-2 are proximate to but separated from second plate 630-1, sixth plate 630-2, third plate 634-1 and seventh plate 634-2, respectively, by interlevel layer 638. First lead 636-1 couples second plate 630-1 to third plate 634-1. Second lead 636-2 couples sixth plate 630-2 to seventh plate 634-2.

Figure 7:
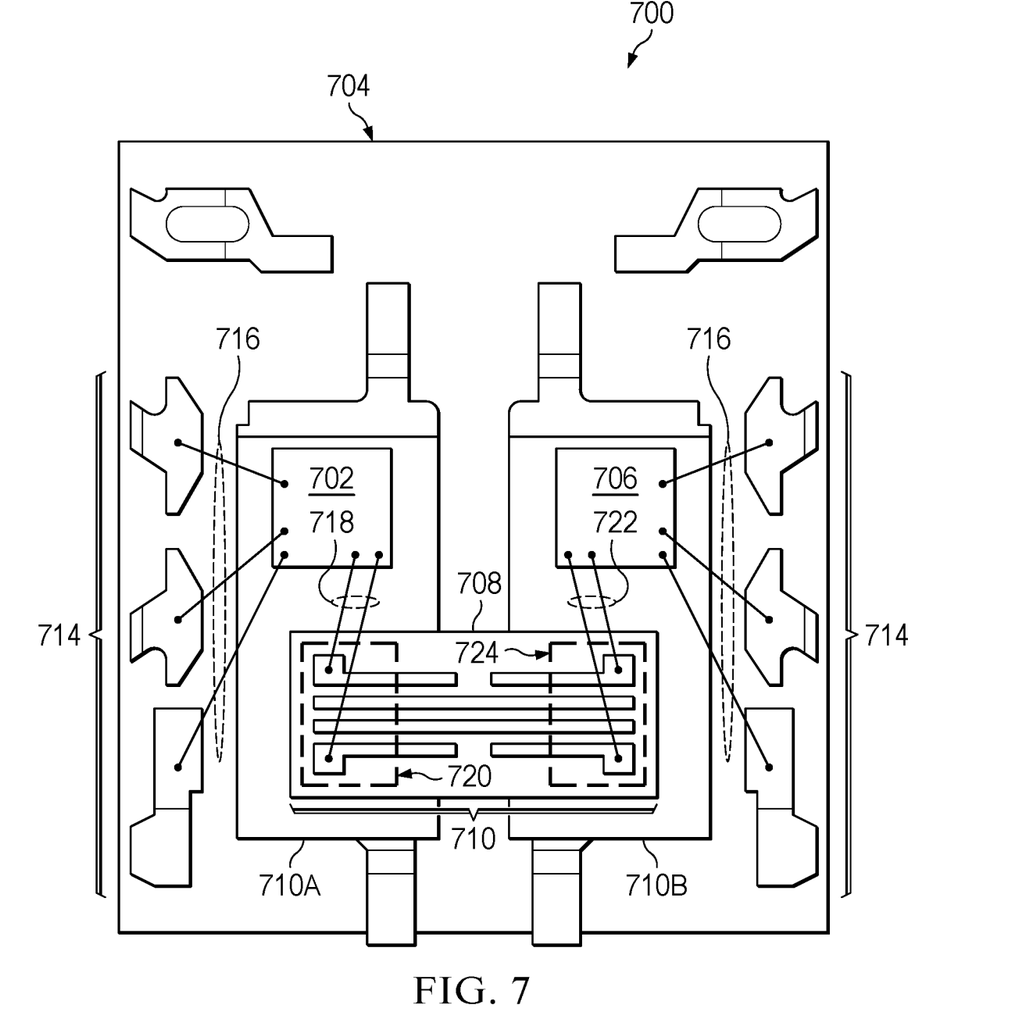
FIG. 7 is a plan view of an example apparatus.

FIG. 7 is a plan view of an example apparatus 700. In this example, apparatus 700 is a hybrid package including a first semiconductor die 702 on a package substrate 704, a second semiconductor die 706 on the package substrate 704 and an assembly 708 on the package substrate. In this example, first semiconductor die 702 is a controller for controlling the second semiconductor die 706, which a driver for providing driving power to an external component (not shown). In this example, first semiconductor die 702, second semiconductor die 706 and assembly 708 are attached to die attach pad 710. In this example, die attach pad 710 is split into die attach pad 710A and die attach pad 710B. First semiconductor die 702 is attached to die attach pad 710A and second semiconductor die 706 is attached to die attach pad 710B. Assembly 708 is attached to both die attach pad 710A and die attach pad 710B. In this example, first semiconductor die 702 and second semiconductor die 706 are attached to die attach pad 710 using a thermally and electrically conductive paste. Assembly 708 is attached to die attach pad 710 with thermally conductive paste.

Die attach pad 710 is part of package substrate 704, which is a lead frame that includes leads 714. In this example, bond wires 716 couple from bond pads (not shown) on first semiconductor die 702 and second semiconductor die 706 to leads 714. In addition, bond wires 718 couple from bond pads (not shown) on first semiconductor device to bond pads 720 of assembly 708. Bond wires 722 couple from bond pads (not shown) on second semiconductor die 706 to bond pads 724 of assembly 708. In this example, a mold compound (not shown) or other encapsulant structure is used to cover and protect first semiconductor die 702, second semiconductor die 706, assembly 708, bond wires 716, bond wires 718, and bond wires 722. In another example (not shown), first semiconductor die 702, second semiconductor die 706 and assembly 708 have a "flip-chip" configuration where bond pads face package substrate 704 and couple to leads 714 using, for example, solder balls. In this example, package substrate 704 would include multiple levels of metallization to provide the necessary interconnections between first semiconductor die 702, second semiconductor die 706 and assembly 708. The use of a "flip-chip" configuration may allow for a more compact hybrid package and provide higher yield of hybrid packaged devices by avoiding the use of delicate bond wires.

Figure 8:
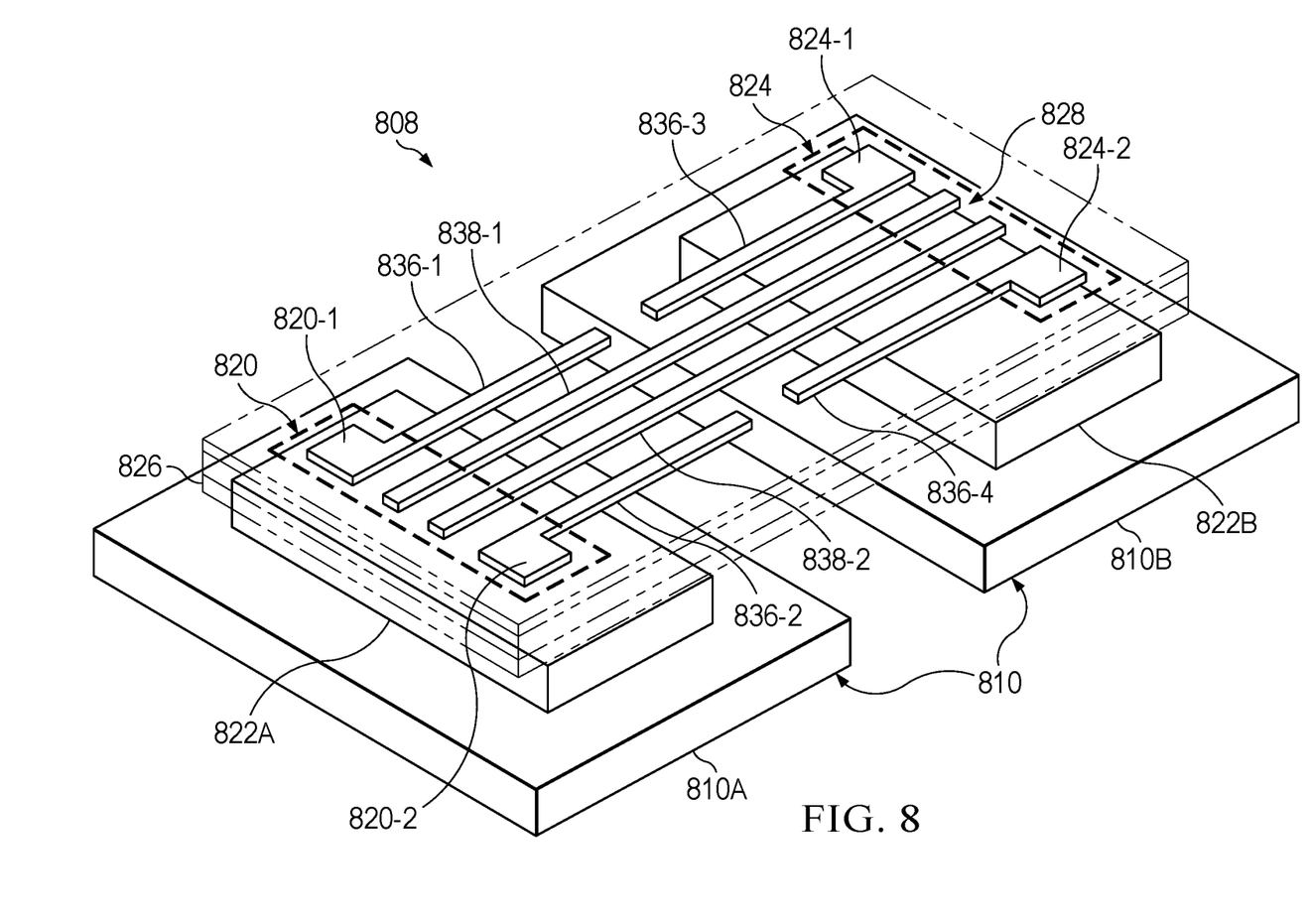
FIG. 8 is a perspective view of an assembly.

FIG. 8 is a perspective view of an assembly 808. For clarity of understanding, similar reference numerals are used for similar elements in FIG. 8 as shown in FIG. 7. Assembly 808 is like assembly 708 (FIG. 7). Bond pads 820 are like bond pads 720 (FIG. 7). Bond pads 824 are like bond pads 724 (FIG. 7). Die attach pad 810, which includes die attach pad 810A and die attach pad 810B, is like die attach pad 710, which includes die attach pad 710A and die attach pad 710B (FIG. 7), respectively. Die attach pad 810A includes mesa 822A and die attach pad 810B includes mesa 822B, in this example. Lower portion 826 of assembly 808 has a shape that matches mesa 822A and mesa 822B to facilitate quick and accurate placement of assembly 808. In this example, lower portion 826 is a molding of bismaleimide triazine (BT) resin. In other examples, lower portion is a molding of reinforced fiber glass (FR4), alumina, silicon carbide, aluminum nitride, or another, non-conductive compound. Metal layer 828 is on lower portion 826. In this example, metal layer 828 is a copper alloy. In other examples, metal layer 828 is copper, iron-nickel alloys such as Alloy 42, gold, or gold alloy. In some examples metal layer 828 includes additional platings such as nickel, palladium, tin, gold, solder and combinations such as ENIG (electroless nickel immersion gold) and ENEPIG (electroless nickel, electroless palladium, immersion gold) and combinations to promote solderability, increase adhesion, and to reduce or prevent corrosion or oxidation of metals, such as copper or aluminum. In examples, screen printing or metal deposition followed by photolithographic patterning forms metal layer 828.

Metal layer 828 includes bond pads 820 and bond pads 824. Bond pads 820 includes first bond pad 820-1 and second bond pad 820-2. Bond pads 824 includes third bond pad 824-1 and fourth bond pad 824-2. First lead 836-1 extends from and is coupled to first bond pad 820-1. Second lead 836-2 extends from and is coupled to second bond pad 820-2. Third lead 836-3 extends from and is coupled to third bond pad 824-1. Fourth lead 836-4 extends from and is coupled to fourth bond pad 824-2. First common lead 838-1 is proximate to first lead 836-1 and third lead 836-3. Thus, first lead 836-1 and first common lead 838-1 couple capacitively, and third lead 836-3 and first common lead 838-1 couple capacitively. Therefore, a first lead 836-1, third lead 836-3 and first common lead 838-1 form a communication channel like capacitor 404 and capacitor 406 (FIG. 4). Second common lead 838-2 is proximate to second lead 836-2 and fourth lead 836-4. Thus, second lead 836-2 and second common lead 838-2 couple capacitively, and fourth lead 836-4 and second common lead 838-2 couple capacitively. Therefore, a second lead 836-2, fourth lead 836-4 and second common lead 838-2 form another communication channel like capacitor 404 and capacitor 406 (FIG. 4). Because assembly 808 includes one layer of metal, assembly 808 has a lower cost to manufacture than assembly 608 (FIG. 6), which also provides two communication channels. However, the resolution of the process for patterning the metal layer limits the proximity of the leads. This limits the capacitance of the coupling capacitors and may limit the effectiveness of the communication channel. In another example (not shown), first semiconductor die 802, second semiconductor die 806 and assembly 808 have a "flip-chip" configuration where bond pads face package substrate 804 and couple to leads 814 using, for example, solder balls. In this example, package substrate 804 would include multiple levels of metallization to provide the necessary interconnections between first semiconductor die 802, second semiconductor die 806 and assembly 808. In addition, an insulating layer (not shown) would be included on assembly 808 that covers metal layer 828 except for bond pads 820 and bond pads 824. The use of a "flip-chip" configuration may allow for a more compact hybrid package and provide higher yield of hybrid packaged devices by avoiding the use of delicate bond wires.

Modifications are possible in the described examples, and other examples are possible, within the scope of the claims.

What is claimed is:
1. An apparatus comprising:
a package substrate having a die attach pad;
a first semiconductor die on the die attach pad, the first semiconductor die including a transmitter;
an assembly having a first plate coupled to the transmitter, a second plate separated from the first plate by a dielectric, a third plate, a conductor connected between the third plate and the second plate, and a fourth plate separated from the third plate by the dielectric, wherein the second plate is coupled to a receiver by capacitive coupling between the third plate and the fourth plate; and a second semiconductor die on the die attach pad, the second semiconductor die including the receiver coupled to the second plate.

2. The apparatus of claim 1 wherein the dielectric is a multi-layer dielectric.

3. The apparatus of claim 1 wherein the first semiconductor die is a controller and the second semiconductor die is a driver.

4. The apparatus of claim 1 wherein the transmitter is configured to transmit a signal to the receiver by on-off keying.

5. The apparatus of claim 1 wherein the dielectric is bismaleimide triazine.

6. The apparatus of claim 1 wherein the first semiconductor die is configured to operate at a voltage of between 1.5 and 5 volts, and the second semiconductor die is configured to operate at 20 volts or more.

7. The apparatus of claim 1 wherein the transmitter is coupled to the first plate by a first bond wire and the receiver is coupled to the second plate by a second bond wire.

8. The apparatus of claim 1 wherein the die attach pad includes a first die attach pad and a second die attach pad, and wherein the first semiconductor die is on the first die attach pad, the second semiconductor die is on the second die attach pad and the assembly is on the first die attach pad and the second die attach pad.

9. A packaged semiconductor device, comprising:
a package substrate having a die attach pad;
a first semiconductor die on the die attach pad, the first semiconductor die including a first transmitter, a second transmitter, a first receiver and a second receiver;
an assembly having:
a first plate coupled to the first transmitter, a second plate separated from the first plate by a dielectric, a third plate, a first conductor coupling the second plate and the third plate, and a fourth plate separated from the third plate by the dielectric;
a fifth plate coupled to the second transmitter, a sixth plate separated from the fifth plate by the dielectric, a seventh plate, a second conductor coupling the sixth plate and the seventh plate, and an eighth plate separated from the seventh plate by the dielectric;
a ninth plate coupled to the first receiver, a tenth plate separated from the ninth plate by the dielectric, an eleventh plate, a third conductor coupling the tenth plate and the eleventh plate, and a twelfth plate separated from the eleventh plate by the dielectric;
a thirteenth plate coupled to the second receiver, a fourteenth plate separated from the thirteenth plate by the dielectric, a fifteenth plate, a fourth conductor coupling the fourteenth plate and the fifteenth plate, and a sixteenth plate separated from the fifteenth plate by the dielectric; and
a second semiconductor die on the die attach pad, the second semiconductor die including a third receiver coupled to the fourth plate, a fourth receiver coupled to the eighth plate, a third transmitter coupled to the twelfth plate and a fourth transmitter coupled to the sixteenth plate.

10. The packaged semiconductor device of claim 9 wherein the die attach pad includes a first part and the first semiconductor die is on the first part, and the die attach pad includes a second part and the second semiconductor die is on the second part.

11. The packaged semiconductor device of claim 9 wherein the first transmitter is configured to transmit a signal to the third receiver, the second transmitter is configured to transmit a signal the fourth receiver, the third transmitter is configured to transmit a signal to the first receiver, and the fourth transmitter is configured to transmit a signal to the second receiver, by on-off keying.

12. The packaged semiconductor device of claim 9 wherein the dielectric is bismaleimide triazine.

13. The packaged semiconductor device of claim 9 wherein the first semiconductor die is configured to operate at a voltage of between 1.5 and 5 volts, and the second semiconductor die is configured to operate at 20 volts or more.

14. The packaged semiconductor device of claim 9 wherein the first transmitter is coupled to the first plate by a first bond wire and the third receiver is coupled to the fourth plate by a second bond wire, the second transmitter is coupled to the fifth plate by a third bond wire and the fourth receiver is coupled to the eighth plate by a fourth bond wire, the third transmitter is coupled to the twelfth plate by a fifth bond wire and the first receiver is coupled to the ninth plate by a sixth bond wire, and the fourth transmitter is coupled to the sixteenth plate by a seventh bond wire and the second receiver is coupled to thirteenth plate by an eighth bond wire.

15. The packaged semiconductor device of claim 9 wherein the package substrate includes a first die attach pad and a second die attach pad, and wherein the first semiconductor die is on the first die attach pad, the second semiconductor die is on the second die attach pad and the assembly is on the first die attach pad and the second die attach pad.

* * * * *